(12) United States Patent
Louviere et al.

(10) Patent No.: US 11,489,606 B2
(45) Date of Patent: Nov. 1, 2022

(54) DEVICE CALIBRATION FOR ISOCHRONOUS CHANNEL COMMUNICATION

(71) Applicant: Cirrus Logic International Semiconductor Ltd., Edinburgh (GB)

(72) Inventors: Anthony Louviere, Austin, TX (US); John L. Melanson, Austin, TX (US); Gabriel Vogel, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 17/150,170

(22) Filed: Jan. 15, 2021

(65) Prior Publication Data
US 2022/0231775 A1    Jul. 21, 2022

(51) Int. Cl.
| H04B 1/38 | (2015.01) |
| H04J 3/06 | (2006.01) |
| H04B 1/40 | (2015.01) |
| H04L 12/40 | (2006.01) |

(52) U.S. Cl.
CPC .............. *H04J 3/0647* (2013.01); *H04B 1/40* (2013.01); *H04L 12/40* (2013.01)

(58) Field of Classification Search
CPC . H04B 1/707; H04B 1/69; H04B 1/40; H04B 3/23; H04L 7/0091; H04L 7/042; H04L 7/0029; H04L 7/0332

USPC ........................................................ 375/219
See application file for complete search history.

(56) References Cited

U.S. PATENT DOCUMENTS

| 9,780,736 B1* | 10/2017 | Fronczak ................. H03F 1/30 |
| 2012/0099383 A1* | 4/2012 | Kim ..................... G11C 7/1057 365/189.05 |
| 2015/0200765 A1* | 7/2015 | Bonaccio ............. H03L 7/0814 375/374 |
| 2019/0187929 A1* | 6/2019 | Srivastava ........... G11C 29/028 |
| 2019/0215146 A1* | 7/2019 | Ke ......................... H03M 9/00 |

* cited by examiner

*Primary Examiner* — Khai Tran
(74) *Attorney, Agent, or Firm* — Norton Rose Fulbright US LLP

(57) ABSTRACT

Calibration of devices communicating on a shared data bus may improve data integrity on the shared data bus by reducing duty cycle distortion. Duty cycle distortion may be reduced by adjusting timing of a transceiver in a device for communicating on the shared data bus using calibration codes. The calibration codes may be loaded into memory and used to reconfigure the transceiver timing on the shared data bus with reconfiguration occurring within one or more unit-intervals of time. The calibration code may be used, for example, to adjust a PMOS or NMOS trim circuit at the transceiver.

20 Claims, 4 Drawing Sheets

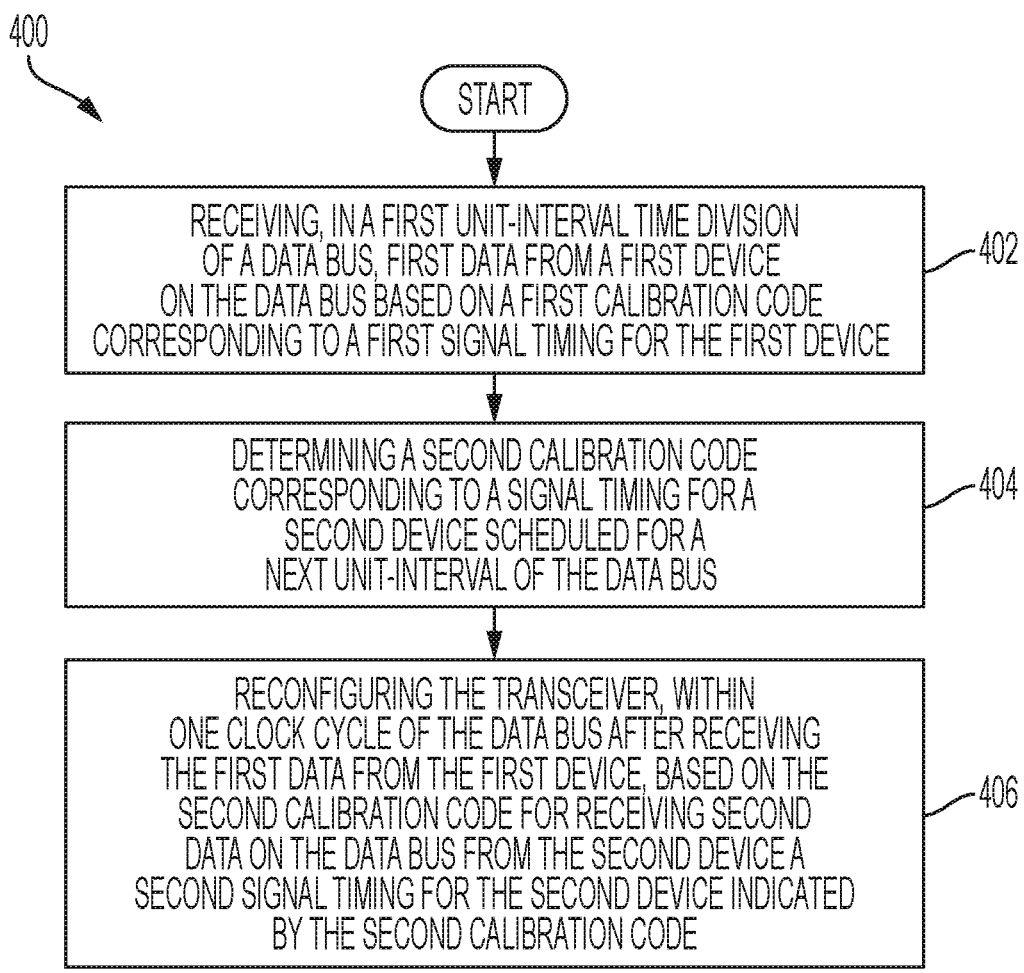

DEVICE CALIBRATION FOR ISOCHRONOUS CHANNEL COMMUNICATION

FIELD OF THE DISCLOSURE

The instant disclosure relates to bus communications. More specifically, portions of this disclosure relate to calibrating timing on a bus interconnecting a host to several client devices.

BACKGROUND

If multiple devices on a shared bus transmit data at the same time, the data may be lost due to conflicts between signals on the shared bus. For example, two devices may transmit two different electrical signals onto a conductor wire that is part of the shared bus. In this example, the signals will collide, resulting in both signals becoming unintelligible to other devices on the shared bus. The number of devices communicating on a shared bus is increasing in consumer devices recently because the number of features desired in consumer devices is increasing. Additional features may involve the addition of more devices communicating with each other to coordinate functionality for a user of the consumer devices. An alternative to sharing a bus is to have separate busses between each of the devices. However, as the number of devices increases, the number of busses rapidly increases. Each bus requires additional circuit board space that negatively affects the form factor of the consumer device by increasing the complexity of making smaller form factors.

Shortcomings mentioned here are only representative and are included to highlight problems that the inventors have identified with respect to existing information handling systems and sought to improve upon. Aspects of the information handling systems described below may address some or all of the shortcomings as well as others known in the art. Aspects of the improved information handling systems described below may present other benefits than, and be used in other applications than, those described above.

SUMMARY

Calibrating devices communicating on the shared bus can assist in reducing conflicts on the bus and the resulting loss of data. For example, a device on the shared bus may have a calibration code for each of the other devices on the shared bus. The calibration code may be used to coordinate timing of data on the shard bus. For example, the calibration code may be used to adjust a configuration of a receive circuit to better align the time the receiver expects to receive data from a device and the time the data actually arrives at the receiver. The improved timing may be obtained by calibrating devices on the shared bus to reduce duty-cycle distortion (DCD). Duty cycle distortion refers to a type of deterministic jitter in which the clock generates positive pulses that are not equal to negative pulses. The calibration described in embodiments of this disclosure address challenges in the physical layer design for transceiver circuits operating on a shared bus by reducing this jitter and thus reduce duty cycle distortion and other timing challenges related to communicating on the shared bus.

In embodiments of the disclosure, a first device on the shared bus, which may be a host device, may be individually calibrated with each device on the shared bus. The calibration may include calibration for transmission from the first device to other devices and/or calibration for reception at the first device from other devices. Thus, the first device may have calibration codes for each other device on the shared bus, and that calibration code used to configure receive and transmit circuitry on the first device to reduce duty-cycle distortion.

In some embodiments, the configuration of transceiver circuitry, including either or both of transmit and receive circuitry, may be completed with a single unit-interval of transmission time on the shared bus. The shared bus may be conceptually divided into unit-intervals in which different devices may communicate on the shared bus. A turn-around interval is used between communications on the shared bus to provide spacing between different device communications and avoid conflict on the shared bus that would result in lost data. This turn-around interval, however, reduces the amount of data that may be communicated over the shared bus because the shared bus remains unused in the turn-around interval. Reducing the turn-around interval increases the amount of data that may be transmitted but increases the likelihood of conflict on the shared bus if the timing of the transmissions is incorrect. Embodiments of this disclosure improve the capability of the devices to time transmissions on the shared bus, which reduces conflicts. In some embodiments, the improved timing allows operating the shared bus with a single unit-interval for turn-around between devices. This single unit-interval is particularly advantageous when a shared bus is shared by many devices because the number of turn-around periods increases as the number of devices on the shared bus increases.

According to one embodiment, an apparatus may include a data bus interface configured to communicate with a plurality of devices over a data bus by time division multiplexing of the data bus into a plurality of unit-intervals, each unit-interval assigned to either one device of the plurality of devices or as a turnaround unit-interval between communications with different devices of the plurality of devices. In some embodiments, the data bus interface is configured to receive data from a differential pair of conductors. The apparatus may also include a transceiver coupled to the data bus interface, the transceiver comprising a memory configured to store a calibration code related to communicating on the data bus. The transceiver may be configured to load a first calibration code into the memory, the first calibration code corresponding to a first device of the plurality of devices assigned to a next unit-interval of the data bus; and to configure the transceiver based on the first calibration code to receive a first signal on the data bus from the first device according to a timing corresponding to the first calibration code.

In certain embodiments, the transceiver is configured to reduce a duty cycle distortion of the first signal based, at least in part, on the first calibration code; the transceiver is configured to reduce the duty cycle distortion based on the first calibration code by adjusting a trim value for at least one of a PMOS transistor or a NMOS transistor coupled to the data bus; the transceiver is configured to load a second calibration code into the memory, the second calibration code corresponding to a second device of the plurality of devices; and/or the transceiver is configured to configure the transceiver based on the second calibration code to receive a second signal on the data bus from the second device according to a timing corresponding to the second calibration code.

The apparatus may determine the first calibration code for the first device and/or other calibration codes for other devices. The calibration may be performed in some embodiments by: receiving a first data stream from the first device through the data bus; determining a baseline jitter measurement for a duty cycle correction based on the first data stream; receiving a second data stream from the first device through the data bus; determining a deterministic jitter based on at least the second data stream and the baseline jitter measurement; determining the first calibration code for the duty cycle correction corresponding to the first device; and/or storing the first calibration code in the memory.

According to another embodiment, a method may include receiving, at a transceiver, first data in a first unit-interval from a first device on a data bus based on a first calibration code corresponding to a first signal timing for the first device; receiving, at a memory coupled to the transceiver, a second calibration code corresponding to a second signal timing for a second device; and/or configuring the transceiver, within one clock cycle of the data bus after receiving the first data from the first device, based on the second calibration code for receiving second data from the second device on the data bus based on the second calibration code corresponding to the second signal timing for the second device.

In some embodiments, the method may further include reducing a duty cycle distortion of the first signal based, at least in part, on the first calibration code; adjusting a trim value for at least one of a PMOS transistor or a NMOS transistor coupled to the data bus; and/or receiving second data in a second unit-interval from the second device on the data bus based on the second calibration code corresponding to the second signal timing for the second device.

The method may also include determining the first calibration code for the first device and/or other calibration codes for other devices. The calibration procedure may include receiving a first data stream from the first device through the data bus; determining a baseline jitter measurement for a duty cycle correction based on the first data stream; receiving a second data stream from the first device through the data bus; determining a deterministic jitter based on at least the second data stream and the baseline jitter measurement; determining the first calibration code for the duty cycle correction corresponding to the first device; and/or storing the first calibration code in the memory.

According to another embodiment, an apparatus may include a host device coupled to a shared data bus and configured to transmit and receive to a plurality of devices coupled to the shared data bus. The host device may be configured to transceive data on the shared by performing steps comprising receiving first data from a first device in a first unit-interval on the shared data bus based on a first calibration code corresponding to a first signal timing for the first device; receiving, at a memory coupled to the transceiver, a second calibration code corresponding to a second signal timing for a second device; and/or configuring, within one unit-interval of the shared data bus after receiving the first data from the first device, based on the second calibration code for receiving second data from the second device on the data bus based on the second calibration code corresponding to the second signal timing for the second device.

In some embodiments, a method is disclosed for correcting a duty cycle for a communications link that allows a host with a host receiver and a host transmitter and a device with a device receiver and a device transmitter to communicate. The method may include sending a first data stream to the device receiver; based on the first data stream, measuring an output of the device receiver to determine a baseline jitter measurement for duty cycle correction; sending via the host transmitter second and subsequent data streams to the device receiver; based on the second and subsequent data streams, identifying whether deterministic jitter exists by comparing the baseline jitter measurement with the jitter measurement from current high side trim settings or current low side trim settings of the receiver comparator output stage; and, in response to the existence of jitter and based on the comparison, calibrating incrementally or decrementally the high side or the low side of the receiver comparator output stage to determine the trim setting and finding the trim code which minimizes jitter in the communication link bitstream.

The method may be embedded in a computer-readable medium as computer program code comprising instructions that cause a processor to perform the steps of the method. In some embodiments, the processor may be part of an information handling system including a first network adaptor configured to transmit data over a first network connection of a plurality of network connections; and a processor coupled to the first network adaptor, and the memory. In some embodiments, the network connection may couple the information handling system to an external component, such as a wired or wireless docking station.

As used herein, the term "coupled" means connected, although not necessarily directly, and not necessarily mechanically; two items that are "coupled" may be unitary with each other. The terms "a" and "an" are defined as one or more unless this disclosure explicitly requires otherwise. The term "substantially" is defined as largely but not necessarily wholly what is specified (and includes what is specified; e.g., substantially parallel includes parallel), as understood by a person of ordinary skill in the art.

The phrase "and/or" means "and" or "or". To illustrate, A, B, and/or C includes: A alone, B alone, C alone, a combination of A and B, a combination of A and C, a combination of B and C, or a combination of A, B, and C. In other words, "and/or" operates as an inclusive or.

Further, a device or system that is configured in a certain way is configured in at least that way, but it can also be configured in other ways than those specifically described.

The terms "comprise" (and any form of comprise, such as "comprises" and "comprising"), "have" (and any form of have, such as "has" and "having"), and "include" (and any form of include, such as "includes" and "including") are open-ended linking verbs. As a result, an apparatus or system that "comprises," "has," or "includes" one or more elements possesses those one or more elements, but is not limited to possessing only those elements. Likewise, a method that "comprises," "has," or "includes," one or more steps possesses those one or more steps, but is not limited to possessing only those one or more steps.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

FIG. 3 is a table illustrating example device calibration codes for communicating on a shared bus according to some embodiments of the disclosure.

FIG. 4 is a flow chart illustrating an example method for one device to communicate with other devices on a shared bus using a device calibration code according to some embodiments of the disclosure.

DETAILED DESCRIPTION

Figure 1:
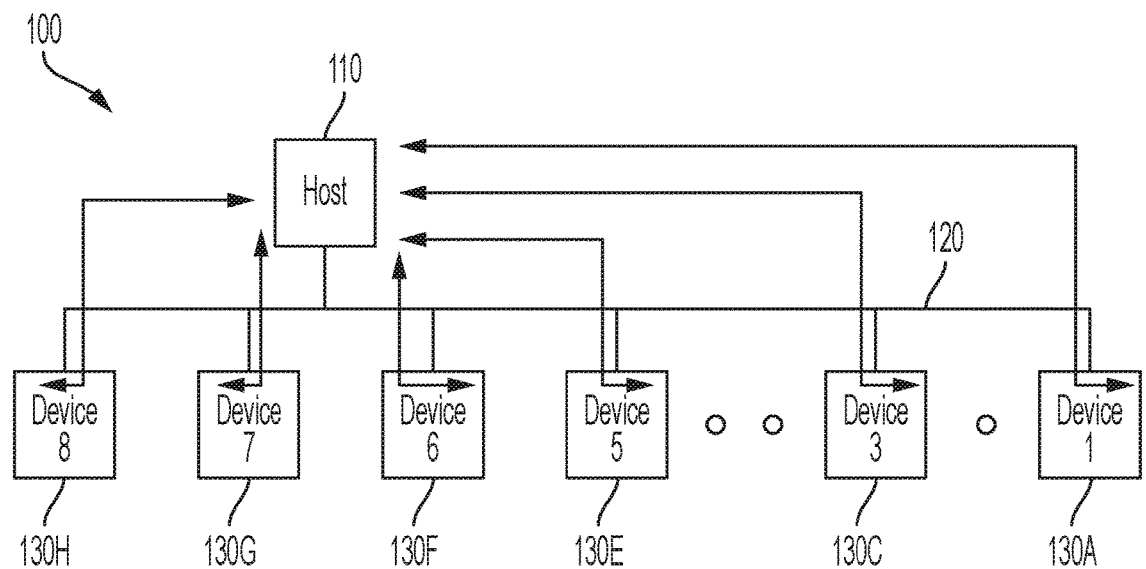
FIG. 1 is a block diagram illustrating an example communications system involving a host device and several client devices communicating over a shared bus according to some embodiments of the disclosure.

FIG. 1 is a block diagram illustrating a communications system involving a host device and several client devices communicating over a shared bus according to some embodiments of the disclosure. A system 100 includes a first device, shown as a host device 110 communicating on a shared bus 120 with eight client devices 130A-H. Although eight devices are shown communicating over the shared bus 120, more than eight or fewer than eight devices may be coupled to the shared bus 120. Further, although the devices may be referred to as a host or client device, the host and client devices may be identical or different in circuitry configuration and may trade functionality on the shared bus 120 such that when there is a difference in functionality between host and client devices the devices may be reconfigurable from host to client or client to host. In some embodiments, the host device 110 may communicate with each of the client devices 130A-H, but each of the client device 130A-H may communicate only with the host device 110. In some embodiments, even when the client devices 130A-H communicate directly only with the host device 110, the data on the shared bus may be visible to all other client devices 130A-H such that client devices 130A-H may indirectly communicate with each other through control of the host device 110.

Figure 2:
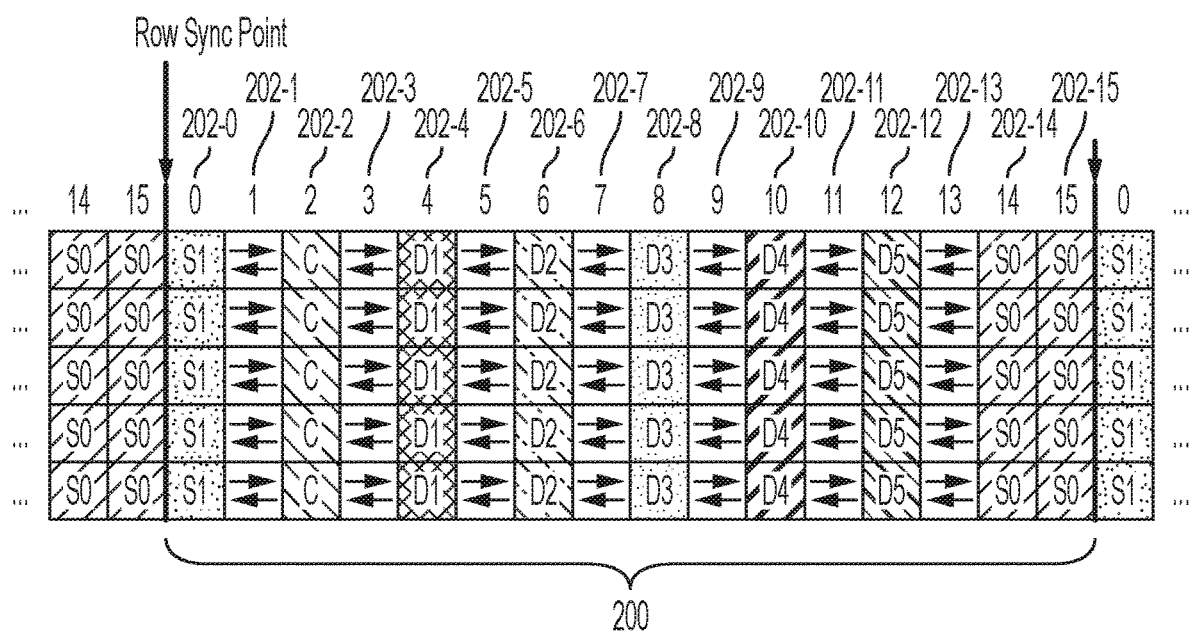
FIG. 2 is a block diagram illustrating an example time division multiplexing scheme for several client devices to communicate using a shared bus with a single unit-interval turnaround according to some embodiments of the disclosure.

Communications on the shared bus 120 from the client devices 130A-H may be performed according to a time divisional multiplexing scheme in which each of the client devices 130A-H is allotted a specific time for transmitting data. In some embodiments, the time division multiplexing involves dividing the available time on the shared bus 120 into unit-intervals of time. Those unit-intervals may be assigned to the devices 130A-H in an equal, sequential manner as illustrated in FIG. 2, or assigned according to different techniques. For example, other techniques may provide an unequal distribution of unit-intervals to the devices 130A-H. Additionally, some unit-intervals of the shared bus 120 may be used to synchronize timing of communications on the shared bus 120 and/or may be used by the host device 110 to send control information to devices 130A-H.

One example timing diagram for communicating in unit-intervals on the shared bus 120 is shown in FIG. 2. FIG. 2 is a block diagram illustrating a time division multiplexing scheme for several client devices to communicate using a shared bus with a single unit-interval turnaround according to some embodiments of the disclosure. A timing period 200 includes unit-intervals 202-0, 202-1, 202-2, . . . 202-15. The example timing 200 may be repeated periodically on the shared bus in fifteen unit-interval patterns. Within the unit-intervals, some unit-intervals may be used for synchronization of communication on the shared bus. For example, unit-intervals 202-14 and 202-15 in each period 200 include 'S0' synchronization unit-intervals in which a zero bit is transmitted by the host device 110. A corresponding 'S1' synchronization unit-interval in which a one bit is transmitted by the host device 110 may be transmitted in unit-interval 202-0. Each of the devices 130A-H may identify the known S0-S0-S1 bit sequence on the shared bus to establish a coarse timing for the unit-intervals 202-0-202-15. The transition from zero to one in the S0-S0-S1 bit sequence may establish the start of each timing period 200.

The host device 110 may also communicate a control bit in unit-interval 202-2. The devices coupled to the shared bus may communicate in assigned unit-intervals, such as unit-interval 202-4 for a first device (D1), unit-interval 202-6 for a second device (D2), unit-interval 202-8 for a third device (D3), unit-interval 202-10 for a fourth device (D4), and unit-interval 202-12 for a fifth device (D5). Each of the unit-intervals for communications may be separated by turn-around periods. The timing period 200 illustrates one unit-interval turn-around periods in unit-intervals 202-1, 202-3, 202-5, 202-7, 202-9, 202-11, and 202-13. Although only five unit-intervals for communicating with five devices D1-D5 are illustrated in the timing period 200, the timing period 200 may be adjusted to accommodate more or less devices, and in some embodiments a larger assigned number (e.g., 2, 3, 4 or more) of unit-intervals for device communications.

The host device 110 may store a table of calibration codes for communicating with the devices on the shared bus 120. The calibration codes may be used to reconfigure the transceiver of the host device 110 to calibration specific to the device that the host device 110 is communicating with. The reconfiguration may occur during the turn-around interval in the period 200, which in some embodiments may result in reconfiguration within a single unit-interval of the shared bus 120. An example calibration code table is shown in FIG. 3. FIG. 3 is a table illustrating device calibration codes for communicating on a shared bus according to some embodiments of the disclosure. The table 300 includes a number of rows 302A-N, with each row associating one of the devices D1-DN with a calibration code DCD_CAL1-DCD_CALN. The duty-cycle distortion (DCD) calibration codes may be determined for all pairs of host and client devices. The codes may be stored locally within each device. The host device may retrieve those codes during an initialization period and store the codes locally in memory of the host device. The code for the device assigned to the next unit-interval may be pre-loaded from the table during the turn-around unit-interval. Dynamically changing calibration codes within the host transceiver based on which device is about to transmit allows for full bi-directional system calibration and reduced jitter timing problems.

A method for operation of a device to reconfigure within a single unit-interval for communication with a device on a shared bus during a next unit-interval is illustrated in FIG. 4. FIG. 4 is a flow chart illustrating a method for one device to communicate with other devices on a shared bus using a device calibration code according to some embodiments of the disclosure. A method 400 begins at block 402 with receiving, in a first unit-interval time division of a data bus, first data from a first device on the data bus based on a first calibration code corresponding to a first signal timing for the first device. Referring to the example timing period of FIG. 2, the receiving at block 402 may correspond to the host device receiving data from device D1 in unit interval 202-4. During the receiving of block 402, the transceiver may be configured to operate according to a first signal timing reflecting the characteristics of the shared bus, the location of the host device and device D1 with respect to the shared bus, and/or the circuitry characteristics specific to the host device and device D1. For example, certain variances in electronic components of the device D1 when manufactured may be specific to D1, with other devices having other variances. The calibration code used to configure the host device for reception of data from device D1 may be used to accommodate these variances, and in particular how these variances affect duty-cycle distortion and jitter involving device D1. After the device D1 allocated unit-interval 202-4 is complete, a turn-around unit interval 202-5 begins.

At block 404, the host device determines a second calibration code corresponding to a signal timing for a second device scheduled for a next unit-interval of the data bus. The determination occurs during the turn-around unit interval 202-5 and may include accessing a table stored at the host device to retrieve the calibration code for device D2 scheduled for transmission in the next unit-interval 202-6.

The calibration code determined at block 404 may be used to reconfigure the transceiver. At block 406, the host device reconfigures the transceiver, within one clock cycle of the data bus after receiving the first data from the first device, based on the second calibration code for receiving second data on the data bus from the second device a second signal timing for the second device indicated by the second calibration code. The reconfiguration may include, for example, adjusting a bias applied to transistors in the transceiver circuit. The adjusted bias may change a timing of a positive clock pulse and/or a negative clock pulse in a duty cycle. In some embodiments, the reconfiguration may include adjusting a trim value for at least one of a P-channel metal-oxide-semiconductor (PMOS) transistor or an N-channel metal-oxide-semiconductor NMOS transistor coupled to the data bus. Other adjustments may include adjusting a trim voltage level, adjusting an offset value, adjusting an amount of asymmetry in a hysteresis loop, adjusting an output current drive, and/or adjusting an R-C delay.

Figure 5:
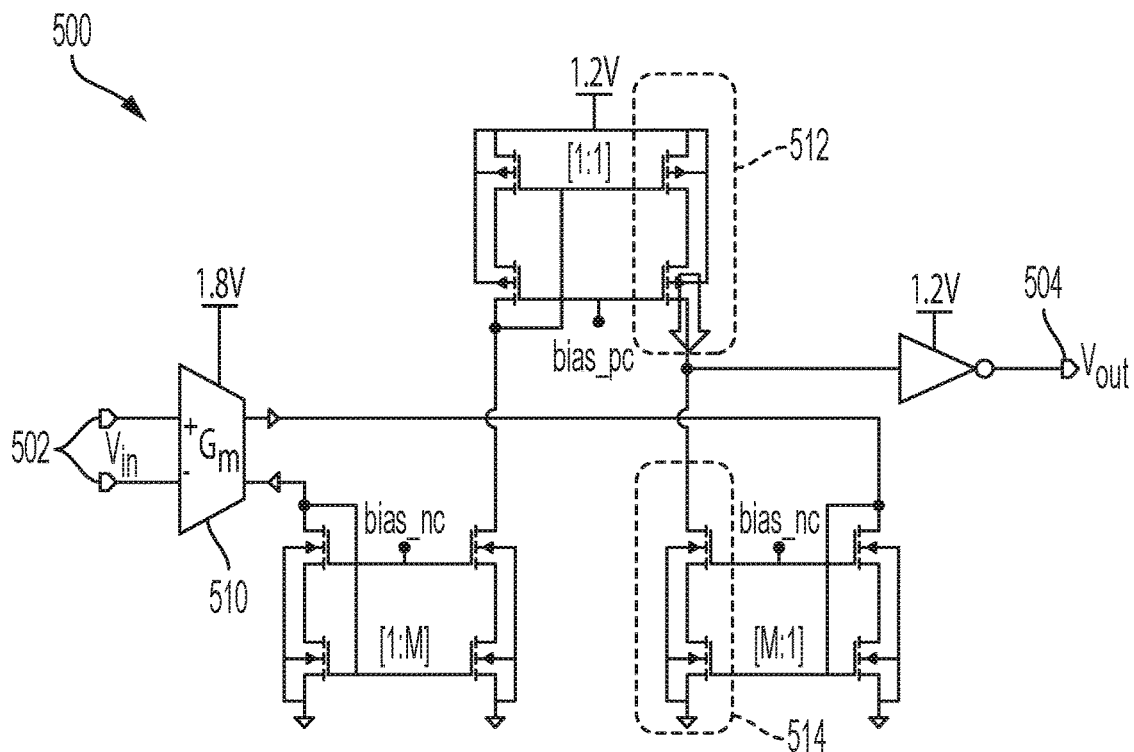
FIG. 5 is a circuit schematic illustrating an example circuit for adjusting timing of a receive circuit according to a device calibration code according to some embodiments of the disclosure.

An example circuit for reconfiguring trim values for transistors in a transceiver according to a calibration code is shown in FIG. 5. FIG. 5 is a circuit schematic illustrating an example circuit for adjusting timing of a receive circuit according to a device calibration code according to some embodiments of the disclosure. A circuit 500 may be a portion of an operation amplifier used in a transceiver. The circuit 500 may include a differential input node 502 that applies a differential signal to a gain stage 510, with the output of the gain stain stage 510 coupled to an output node 504. The input node 502 may be a data bus interface configured to communicate with a plurality of devices over a data bus by time division multiplexing of the data bus into a plurality of unit-intervals, each unit-interval assigned to either one device of the plurality of devices or as a turn-around unit-interval between communications with different devices of the plurality of devices.

Also coupled to the output node may be a PMOS trim circuit 512 for using one or more PMOS (p-type metal-oxide-semiconductor) transistors to adjust the output and/or a NMOS trim circuit 514 for using one or more NMOS (n-type metal-oxide-semiconductor) transistors to adjust the output. A controller may adjust the bias_pc and bias_nc signals applied to the PMOS trim circuit 512 and NMOS trim circuit 514, respectively, based on the calibration code. In some embodiments, other bias currents, such as an actual bias current, or other aspects of the circuit may be adjusted in addition to or in the alternative to the adjustment of the cascode device bias voltages. The bias values may be determined, for example, from a look-up table by matching the calibration code to an entry in the look-up table and using bias_pc and bias_nc values associated with the look-up table entry. In another example, the bias values may be determined according to an equation using the calibration code, such as when the calibration code is an integer value and bias_pc and bias_nc values are a product of the integer value and a constant.

The circuit 500 is one example solution involving a single circuit where rise and fall time mismatches for a clock may be corrected (or calibrated out). Using the trim adjustments in circuits 512 and 514 through adjusting the high- and low-side bias currents may provide a fine adjustment on timing, separate from the coarse timing obtained from the synchronization bits, and reduce transceiver duty cycle distortion. In some embodiments, output stage current mirrors may be calibrated such that rise and fall times at the output of the transceiver are symmetric. In some embodiments, aspects of the disclosure may be applied to other blocks in a transceiver path, such as a digital logic loop (DLL) or transmission circuitry, to reduce duty cycle distortion through calibration.

Figure 6:
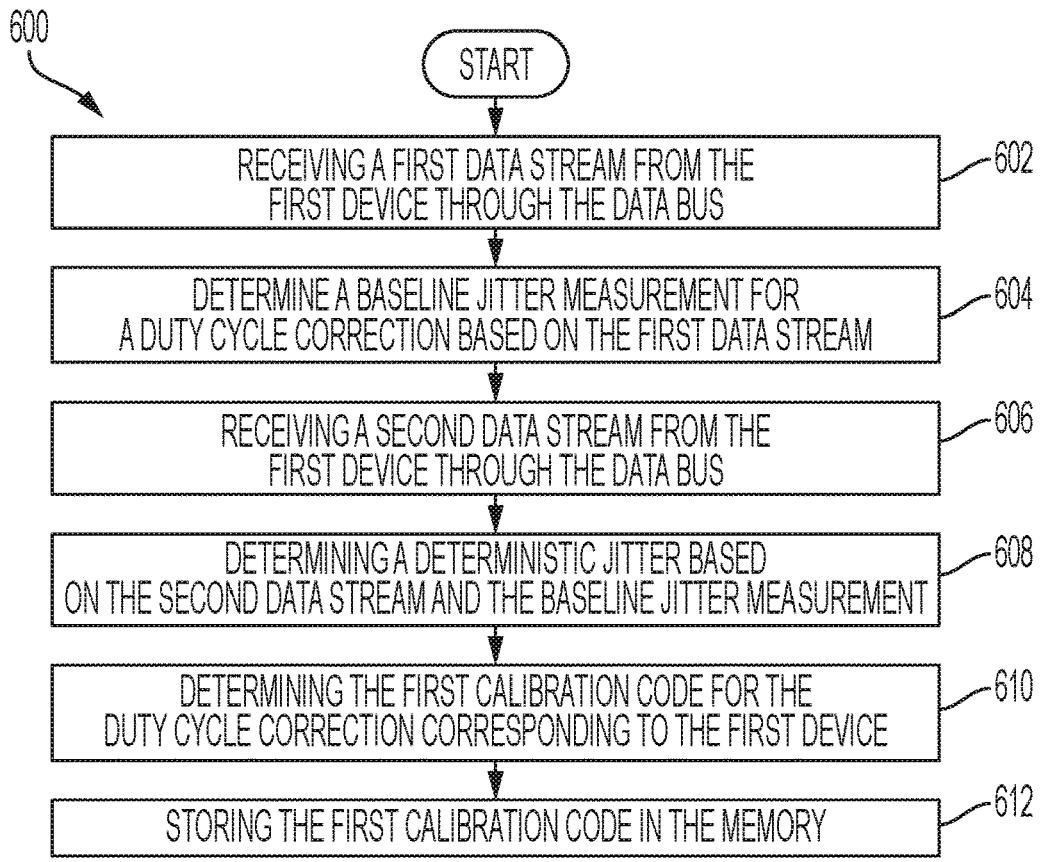
FIG. 6 is a flow chart illustrating an example method for generating a calibration code for a device communicating on a shared bus according to some embodiments of the disclosure.

The calibration codes described above for correcting timing on signals may be obtained through a calibration process. One example of a calibration process is illustrated in FIG. 6. FIG. 6 is a flow chart illustrating a method for generating a calibration code for a device communicating on a shared bus according to some embodiments of the disclosure. A method 600 for generating a calibration code for a first device begins at block 602 with receiving a first data stream from the first device through the data bus. At block 604, a baseline jitter measurement for a duty cycle correction may be determined based on the first data stream. The bias values may be adjusted by incrementing or decrementing the trim values as described with reference to FIG. 5.

The process may be repeated at blocks 606 and 608. At block 606, the host device transmits a second data stream to the first device through the data bus. At block 608, the host device determines a deterministic jitter based on the second data stream and the baseline jitter measurement. In some embodiments, additional data streams beyond the second data stream may be used in the determination of the deterministic jitter. In some embodiments, two jitter measurements may provide information to appropriately increment or decrement the calibration code in a direction that reduces jitter to search for the calibration code that will be determined at block 610 and stored at block 612. If desired, the trim values may be further incremented or decremented based on current value of jitter when compared with the baseline jitter measurement of block 604.

The process may continue to be repeated until the trim values obtain a jitter determination that is within certain criteria, such as a jitter below a certain threshold value. After the trim values obtain a desired jitter level, the calibration code is stored. At block 610, a first calibration code corresponding to the trim values is determined to minimize duty-cycle distortion will be used as duty cycle correction setting. At block 612, the first calibration code is stored in the memory of the host device, such as in a table similar to FIG. 3. The calibration code may also be stored in the first device for later retrieval by the host device or another device.

Figure 7:
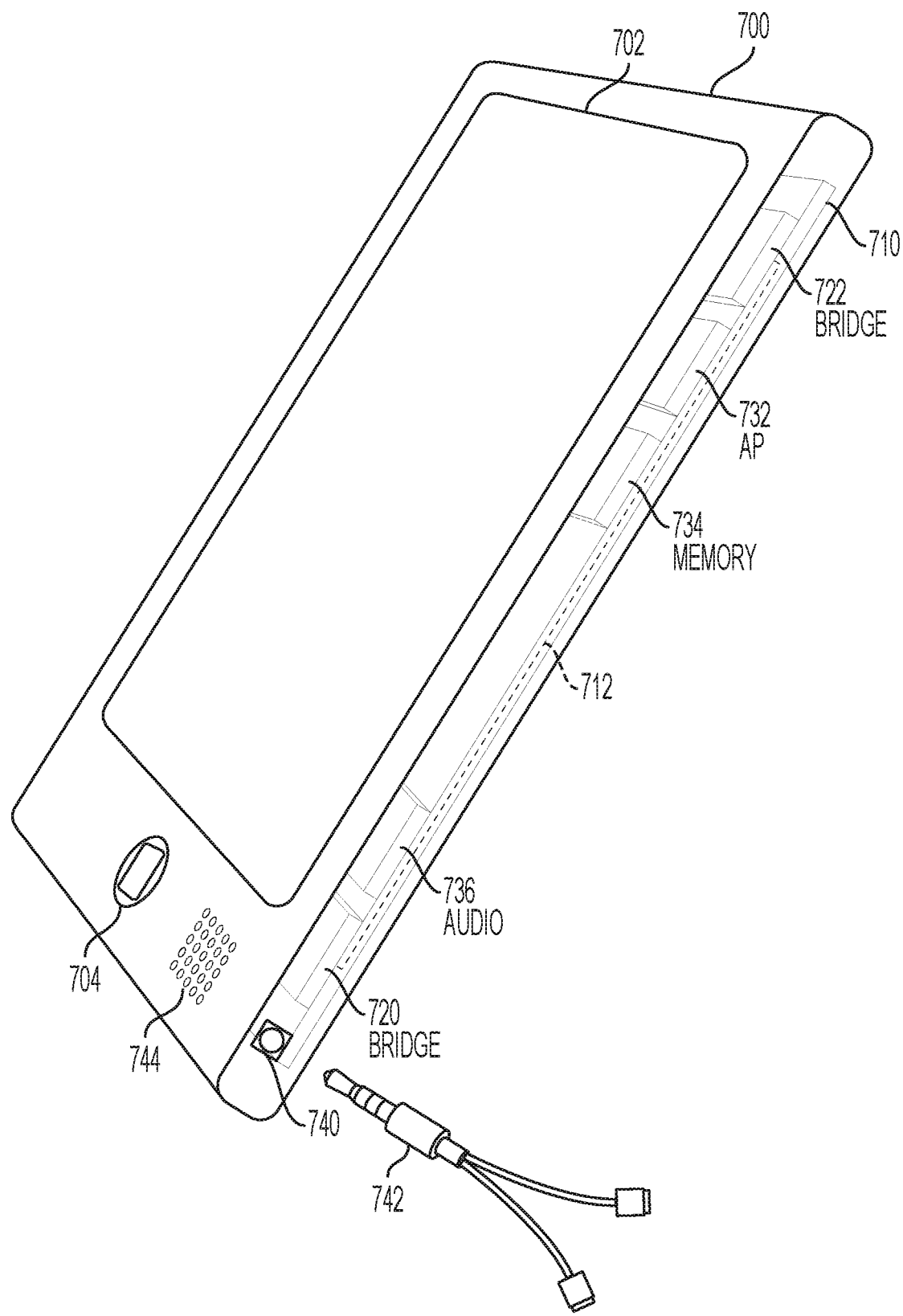
FIG. 7 is a drawing illustrating an example mobile device having a shared bus for communicating between several client devices according to some embodiments of the disclosure.

These example embodiments describe and illustrate various communication techniques for electronic devices to communicate over a shared bus. The techniques may be employed in mobile devices to enable and enhance communications between electronic devices within the mobile device. FIG. 7 is a drawing illustrating a mobile device having a shared bus for communicating between several client devices according to some embodiments of the disclosure. A mobile device 700 may include a display 702 for allowing a user to provide user input to the mobile device 700. One or more physical buttons 704 may also allow a user to provide user input to the mobile device 700. The mobile device 700 may also include a printed circuit board (PCB) 710 interconnecting components that provide the functionality of mobile device 700. For example, an application processor (AP) 732, memory 734, and audio 736 components may be attached to the PCB 710. Communications between the components may be provided through a channel 712 formed as a differential pair of conductors on or in the PCB 710. Communication between bridge chips 720 and 722 coupled to endpoints of the channel 712 may include processing and memory circuitry that provide interfaces for receiving data from components 732, 734, and 736 and packaging the data for transmission on the channel 712. The audio component 736 may provide an audio output signal to a headphone jack 740, for driving a transducer, such as headphones 742. The audio component 736 may also be coupled to an internal speaker 744. The audio component 736 may provide signal processing, digital-to-analog conversion (DAC), filtering, and/or amplification to audio files received from memory 734 for output to a user. Although the data received at the audio component 736 is described as received from memory 734, the audio data may also be received from other sources, such as a USB connection, a device connected through Wi-Fi to the mobile device 700, a cellular radio, an Internet-based server, another wireless radio, and/or another wired connection.

In some embodiments, the bridge chips 720 and 722 may be configured in a master-slave arrangement. For example, a host bridge chip 722 may be coupled to the AP 732 of mobile device 700 and slave bridge chip 720 may be coupled to a microphone, analog-to-digital converter (ADC), digital-to-analog converter (DAC), amplifier, digital signal processor (DSP), and/or (CODEC) within the mobile device. Embodiments of the present disclosure are useful for audio-enabled equipment. For example, multiple slave bridge chips may each individually be coupled to separate components, such as a microphone, speaker, and DAC, allowing the AP to communicate to the components through a single differential wired bus.

Techniques for communicating on a shared data bus as described in this disclosure may be applied to one or more communications within the mobile device 700. For example, the techniques may be applied to communication between bridge chip 720, as a host device, and several components including audio component 736. As another example, techniques described above may be applied to communication between bridge chip 722 and components 732 and 734 when components 732 and 734 share a data bus.

The schematic flow chart diagrams of FIG. 4 and FIG. 6 are generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The operations described above as performed by a host device may be performed by a controller embedded in the host device, a controller coupled to the host device but external to the host device, and/or a combination of logic circuitry in the host device and external to the host device. The functionality may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general-purpose processor capable of executing instructions contained in software and/or firmware.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc include compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As an example, although processing of certain kinds of data may be described in example embodiments, other kinds or types of data may be processed through the methods and devices described above. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
   a data bus interface configured to communicate with a plurality of devices over a data bus by time division multiplexing of the data bus into a plurality of unit-intervals, wherein at least a first unit interval of the plurality of unit intervals is assigned to at least a first device of the plurality of devices and at least a second unit interval of the plurality of unit intervals is assigned to a turnaround unit-interval between communications with different devices of the plurality of devices;
   a transceiver coupled to the data bus interface, the transceiver comprising a memory configured to store a calibration code related to communicating on the data bus, and wherein the transceiver is configured to:
   load a first calibration code into the memory, the first calibration code corresponding to a first device of the plurality of devices assigned to a next unit-interval of the data bus; and
   receive a first signal on the data bus from the first device according to a timing corresponding to the first calibration code.

2. The apparatus of claim 1, wherein the transceiver is configured to reduce a duty cycle distortion of the first signal based, at least in part, on the first calibration code.

3. The apparatus of claim 2, wherein the transceiver is configured to reduce the duty cycle distortion based on the first calibration code by adjusting a trim value for at least one of a PMOS transistor or a NMOS transistor coupled to the data bus.

4. The apparatus of claim 1, wherein the transceiver is configured, after receiving the first signal from the first device based on the first calibration code in the next unit-interval, to:
   load a second calibration code into the memory, the second calibration code corresponding to a second device of the plurality of devices; and
   receive, based on the second calibration code, a second signal on the data bus from the second device according to a timing corresponding to the second calibration code.

5. The apparatus of claim 1, wherein the transceiver is configured to determine the first calibration code by performing steps comprising:
   receiving a first data stream from the first device through the data bus;
   determining a baseline jitter measurement for a duty cycle correction based on the first data stream;
   receiving a second data stream from the first device through the data bus;
   determining a deterministic jitter based on at least the second data stream and the baseline jitter measurement;
   determining the first calibration code for the duty cycle correction corresponding to the first device based on the deterministic jitter; and
   storing the first calibration code in the memory.

6. The apparatus of claim 1, wherein the apparatus comprising a mobile device, and wherein the first device comprises an audio component.

7. The apparatus of claim 1, wherein the data bus interface is configured to receive data from a differential pair of conductors.

8. A method, comprising:
   receiving, at a transceiver and based on a first calibration code corresponding to a first signal timing for a first device, first data in a first unit-interval from the first device on a data bus;
   receiving, at a memory coupled to the transceiver, a second calibration code corresponding to a second signal timing for a second device; and
   configuring the transceiver, within one clock cycle of the data bus after receiving the first data from the first device, based on the second calibration code for receiving second data from the second device on the data bus.

9. The method of claim 8, wherein the configuring comprises reducing a duty cycle distortion of the first signal based, at least in part, on the first calibration code.

10. The method of claim 9, wherein the transceiver is configured to reduce the duty cycle distortion based on the first calibration code by adjusting a trim value for at least one of a PMOS transistor or a NMOS transistor coupled to the data bus.

11. The method of claim 8, further comprising receiving second data in a second unit-interval from the second device on the data bus based on the second calibration code corresponding to the second signal timing for the second device.

12. The method of claim 8, further comprising determining the first calibration code by performing steps comprising:
   receiving a first data stream from the first device through the data bus;
   determining a baseline jitter measurement for a duty cycle correction based on the first data stream;
   receiving a second data stream from the first device through the data bus;

determining a deterministic jitter based on at least the second data stream and the baseline jitter measurement;

determining the first calibration code for the duty cycle correction corresponding to the first device based on the deterministic jitter; and storing the first calibration code in the memory.

13. The method of claim 8, wherein receiving the first data comprises receiving audio component data.

14. An apparatus, comprising:
a host device coupled to a data bus, the host device configured to perform steps comprising:
   receiving, based on a first calibration code corresponding to a first signal timing for a first device, first data from the first device in a first unit-interval on the data bus;
   receiving, at a memory coupled to the host device, a second calibration code corresponding to a second signal timing for a second device; and
   configuring, within one unit-interval of the data bus after receiving the first data from the first device, based on the second calibration code for receiving second data from the second device on the data bus.

15. The apparatus of claim 14, wherein the configuring comprises configuring a transceiver of the host device.

16. The apparatus of claim 15, wherein the configuring comprises reducing a duty cycle distortion of the first signal based, at least in part, on the first calibration code.

17. The apparatus of claim 14, wherein the configuring comprises adjusting a trim value for at least one of a PMOS transistor or a NMOS transistor coupled to the data bus based, at least in part, on the second calibration code.

18. The apparatus of claim 14, wherein the host device is configured to determine the first calibration code by performing steps comprising:
   receiving a first data stream from the first device through the data bus;
   determining a baseline jitter measurement for a duty cycle correction based on the first data stream;
   receiving a second data stream from the first device through the data bus;
   determining a deterministic jitter based on at least the second data stream and the baseline jitter measurement;
   determining the first calibration code for the duty cycle correction corresponding to the first device based on the deterministic jitter; and
   storing the first calibration code in the memory.

19. A method, comprising:
loading, by a transceiver coupled to a data bus interface configured to communicate with a plurality of devices over a data bus by time division multiplexing of the data bus into a plurality of unit-intervals, wherein at least a first unit interval of the plurality of unit intervals is assigned to at least a first device of the plurality of devices and at least a second unit interval of the plurality of unit intervals is assigned to a turnaround unit-interval between communications with different devices of the plurality of devices, a first calibration code into a memory, the first calibration code corresponding to a first device of the plurality of devices assigned to a next unit-interval of the data bus; and
configuring the transceiver based on the first calibration code to receive a first signal on the data bus from the first device according to a timing corresponding to the first calibration code.

20. The method of claim 19, wherein the step of configuring the transceiver comprises adjusting a trim value for at least one of a PMOS transistor or a NMOS transistor of the transceiver coupled to the data bus, wherein the transceiver is configured to reduce a duty cycle distortion of the first signal based, at least in part, on the first calibration code.

* * * * *

UNITED STATES PATENT AND TRADEMARK OFFICE
CERTIFICATE OF CORRECTION

| | |
|---|---|
| PATENT NO. | : 11,489,606 B2 |
| APPLICATION NO. | : 17/150170 |
| DATED | : November 1, 2022 |
| INVENTOR(S) | : Louviere et al. |

It is certified that error appears in the above-identified patent and that said Letters Patent is hereby corrected as shown below:

In the Specification

In Column 1, Line 50, delete "shard bus." and insert -- shared bus. --, therefor.

In Column 10, Lines 43-44, delete "electronically programmable read-only memory (EPROM)," and insert -- erasable programmable read-only memory (EPROM), --, therefor.

Signed and Sealed this
Fourteenth Day of February, 2023

*Katherine Kelly Vidal*

Katherine Kelly Vidal
*Director of the United States Patent and Trademark Office*